US006555476B1

(12) United States Patent
Olsen et al.

(10) Patent No.: US 6,555,476 B1
(45) Date of Patent: Apr. 29, 2003

(54) SILICON CARBIDE AS A STOP LAYER IN CHEMICAL MECHANICAL POLISHING FOR ISOLATION DIELECTRIC

(75) Inventors: Leif C. Olsen, Plano, TX (US); Leland S. Swanson, McKinney, TX (US); Henry L. Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/217,123

(22) Filed: Dec. 21, 1998

Related U.S. Application Data

(60) Provisional application No. 60/068,661, filed on Dec. 23, 1997.

(51) Int. Cl.$^7$ ................ H01L 21/302; H01L 21/304; H01L 21/3065
(52) U.S. Cl. .............. 438/692; 438/695; 438/697; 438/700; 438/706; 438/723; 438/724
(58) Field of Search .................. 438/692, 695, 438/697, 700, 723, 724, 706

(56) References Cited

U.S. PATENT DOCUMENTS

| | | | |
|---|---|---|---|
| 4,929,837 A | * 5/1990 | DiVita et al. ............ 250/461.1 |
| 4,954,142 A | 9/1990 | Carr et al. ................. 51/309 |
| 5,084,071 A | 1/1992 | Nenadic et al. ............ 51/309 |
| 5,317,346 A | * 5/1994 | Garcia ..................... 346/140 |
| 5,356,513 A | 10/1994 | Burke et al. ............... 156/636 |
| 5,362,669 A | 11/1994 | Boyd et al. ................ 438/437 |
| 5,510,652 A | 4/1996 | Burke et al. ............... 257/760 |
| 5,693,234 A | * 12/1997 | Peters ...................... 216/2 |
| 5,933,748 A | * 8/1999 | Chou et al. ................ 438/431 |
| 5,958,795 A | * 9/1999 | Chen et al. ................ 438/692 |
| 5,960,297 A | * 9/1999 | Saki ........................ 438/424 |
| 5,966,616 A | * 10/1999 | Woerlee .................... 438/424 |

FOREIGN PATENT DOCUMENTS

| | | | |
|---|---|---|---|
| DK | 4310345 A1 | * 10/1994 | ............ C23F/4/00 |
| EP | 545263 A2 | 6/1993 | ........... H01L/21/76 |
| JP | 404213857 A | * 8/1992 | |

OTHER PUBLICATIONS

Boos et al., Dry etching silicon carbide in plasma reactor—using chlorine–contg. gas for reactive ion etching and silica di:oxide mask, English Abstract of DE 4310345 A1, Oct. 6, 1994, 2 pages.*

IBM Technical Disclosure Bulletin, III–V Semiconductor Ion Implantation Annealing Capping, Dec. 1, 1986, vol. 29, No. 7, 3 pages.*

Chemical–Mechanical Polishing of Interlayer Dielectric: A Review; Ali et al.; Solid State Technology, Oct. 1994; pp. 63–70.

Optimized Process Developed for Tungsten CMP; Kim et al.; Semiconductor International; Nov. 1995; pp. 119–123.

Advances in CMP; DeJule; Semiconductor International; Nov. 1996; pp. 88–98.

* cited by examiner

*Primary Examiner*—William A. Powell
*Assistant Examiner*—Lynette T. Umez-Eronini
(74) *Attorney, Agent, or Firm*—Carlton H. Hoel; W. James Brady; Frederick J. Telecky, Jr.

(57) ABSTRACT

Silicon carbide is used for a hardmask for the isolation dielectric etch and also serves as an etch stop for chemical-mechanical polishing. Alternatively, silicon carbonitride or silicon carboxide can be used.

8 Claims, 2 Drawing Sheets

SILICON CARBIDE AS A STOP LAYER IN CHEMICAL MECHANICAL POLISHING FOR ISOLATION DIELECTRIC

This application is an expanded version of U.S. Provisional Application Ser. No. 60/068,661, filed 12/23/97.

BACKGROUND AND SUMMARY OF THE INVENTION

The present invention relates to integrated circuit structures and fabrication methods, and particularly to chemical mechanical polish (CMP) stops used for isolation dielectric planarization.

BACKGROUND: CMP

Chemical mechanical polishing (CMP) is a planarization technique which has become increasingly important in integrated circuit processing in the 1990s. CMP, unlike most other planarization techniques, provides global planarization. This global planarization avoids problems of step coverage, and hence helps achieve the numerous multiple layers of metallization which are now desired. Global planarization also improves lithographic resolution, by removing constraints on the depth of field.

In a CMP process, a wafer is polished in a slurry of a very fine abrasive (typically alumina, $Al_2O_3$). The slurry has a chemical composition which accelerates removal of the top surface. For example, for removal of tungsten an acidic and oxidizing slurry is used; this helps to convert the surface of the tungsten into a tungsten oxide, which is easily removed by the mechanical polishing operation. For removal of dielectrics, a basic chemistry is more typically used.

General discussion of CMP techniques can be found in Ali et al., "Chemical-mechanical polishing of interlayer dielectric: a review," which appeared at page 63 of the October 1994 issue of SOLID STATE TECHNOLOGY, and references cited therein. (Note, however, that this article is particularly focussed on dielectric removal.) Additional discussion can be found in DeJule, "Advances in CMP," SEMICONDUCTOR INTERNATIONAL, November 1996, at pages 88 and following, and references cited therein; and in Kim et al., "Optimized Process Developed for Tungsten CMP," SEMICONDUCTOR INTERNATIONAL, November 1996, at pages 119 and following. All of these materials are hereby incorporated by reference.

BACKGROUND: SILICON NITRIDE AS CMP STOP

To provide the degree of uniformity which is desirable in planarizing integrated circuit processes, CMP stop layers are commonly used with CMP processes. One such CMP stop which is frequently desired is for oxide polishing. This is commonly done by including islands of silicon nitride, and using a slurry which achieves some selectivity to the nitride. However, the selectivities which are achieved with standard slurries are small, only of the order of 4 to 1 or so.

Current state of the art uses silicon nitride as both a silicon etch hardmask, and as a CMP stop layer for chemical-mechanical polishing (CMP). Since the removal selectivity of silicon dioxide to silicon nitride is only 4:1 or 5:1 using industry-accepted slurries, the silicon nitride layer is not an effective CMP polish stop layer. Non-uniformity due to polish and pattern effects can cause the dielectric $SiO_2$ and silicon nitride over small isolated active device features to be polished much more quickly than other features, thus causing damage to these small active regions.

Some attempts have been made to achieve higher oxide:nitride selectivities by using other chemistries. One example of this is a chemistry in which the standard SS25 silica polishing slurry is modified by the addition of tetramethyl ammonium fluoride. However, the use of silicon nitride requires either a patterned etchback approach (which requires additional lithography steps) or the use of CMP slurries which include chemicals to passivate the silicon nitride surface and provide high selectivity in CMP removal of $SiO_2$. The patterned etchback approach is more expensive than other approaches. High selective slurries are not in mass production and have not yet gained wide industry acceptance, partly because they are difficult to clean from the wafer surface after CMP processing, and they have limited shelf and pot lives.

CMP Process With Silicon Carbide Polish Stop Layers

The present application discloses innovations which use silicon carbide layers in CMP process, or alternatively, a silicon carbonitride or silicon carboxide. It has been found that standard polishing chemistries will very easily give an extremely high selectivity (50 to 1 or better) between silicon dioxide and silicon carbide. This means that non-uniformities in oxide thickness or in polish rate will be smoothed out when the faster etching areas can be covered by polish stop layers. It has also been found that silicon nitride can also be polished selectively with respect to silicon carbide, with a polish rate ratio which is greater than 12 to 1. One particularly important embodiment of the disclosed process is to provide a polish stop layer for planarization of the isolation dielectric, such as shallow trench isolation, prior to formation of transistors. A layer of silicon carbide is deposited and patterned to serve as a hardmask for the trench etch. After filling of the trenches with dielectric, the silicon carbide serves as a polish stop, allowing a smoother planarization than is otherwise possible. Using a dummy moat is required with this solution.

Advantages of the disclosed methods and structures include:

- additional (addition to moat pattern) patterned etch steps are not needed;
- slurries with wide industry acceptance can be used;
- less expensive than currently accepted approaches that use silicon nitride and reverse moat pattern and etchback;
- requires fewer process steps than patterned etchback approaches;
- compatible with existing CMP slurries;
- compatible with pads which have wide industry acceptance.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of Presently Preferred Embodiment

Figure 1:
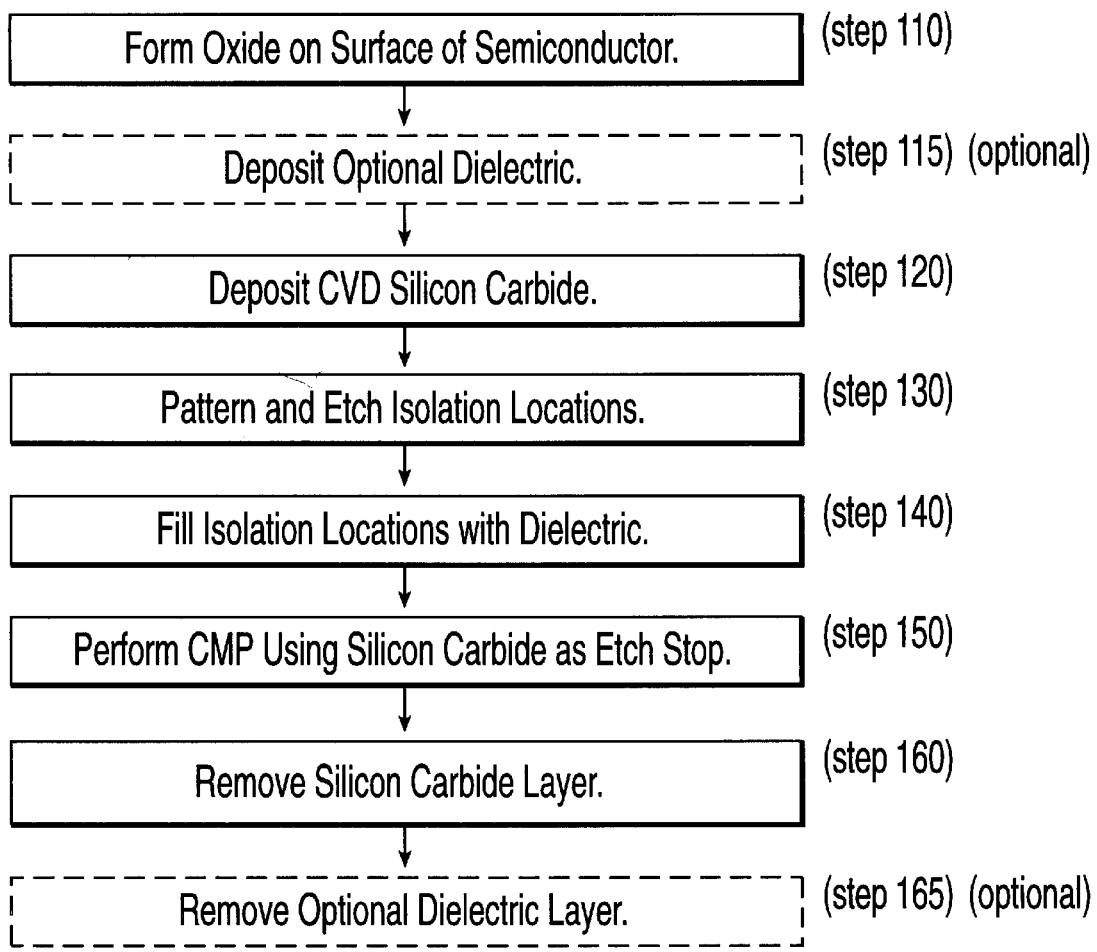
FIG. 1 is a flowchart of the disclosed process using silicon carbide.

FIG. 1 is a flowchart of the presently preferred embodiment of the disclosed process, which will now be discussed with regard to FIGS. 2A–2C. The process begins with a bare wafer on which an oxide is grown (step 110) to a thickness of approximately 7.5-30 nm. Optionally, a thin dielectric underlayer (not shown) can be deposited at this time. In the presently preferred embodiment, this can be silicon nitride having a thickness between 20 and 300 nm. This is followed by deposition of approximately 20-250 nm of silicon carbide (step 120). In the presently preferred embodiment, the silicon carbide is deposited in a single plasma-enhanced chemical vapor deposition (PECVD) process, with the following recipe:

| | |
|---|---|
| Source gas: | silane/methane, trimethylsilane, or other organosilicon gas; |
| Carrier gas: | Ar or He; |
| Pressure | about 2–8 Torr; |
| Gas flow | 500–5000 sccm; |
| RF power density | about 2 W/cm2 (13.56 MHz); |
| Substrate temperature | 200–500 (preferably 350) degrees C. |

Figure 2A:
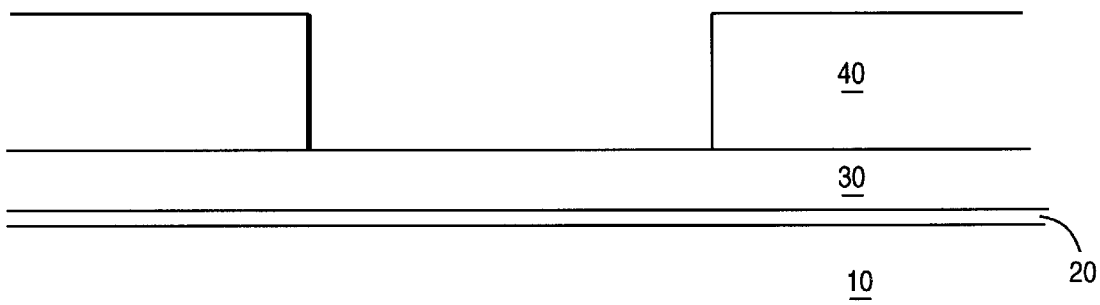
FIGS. 2A–2C show a cross-section of a wafer during various steps in the disclosed process.
Figure 2B:
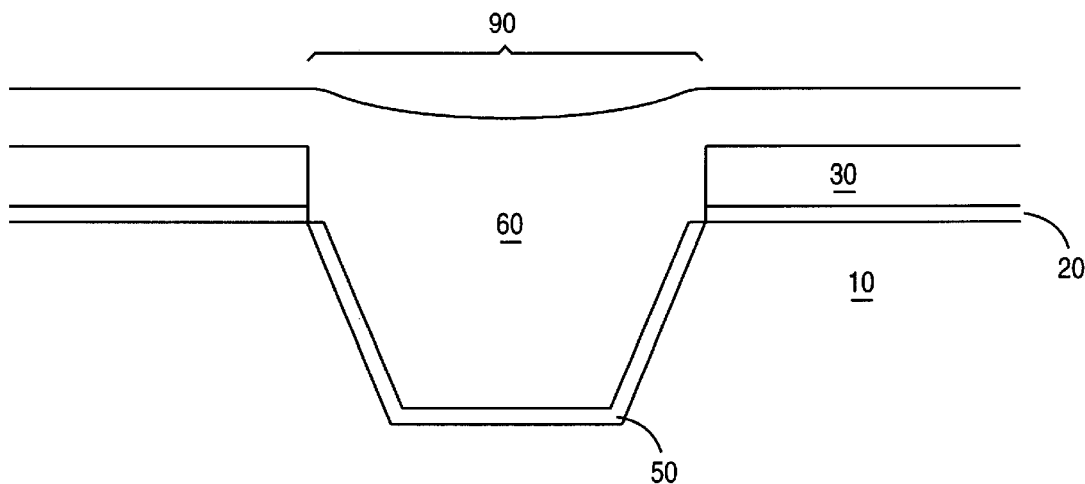
Figure 2C:
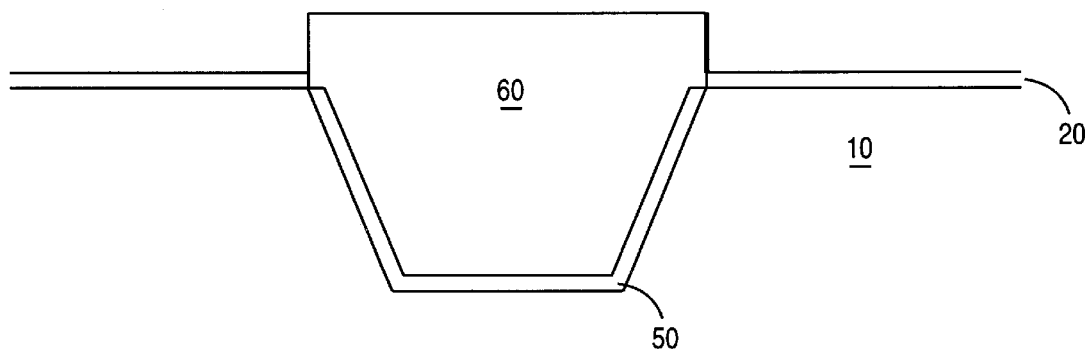

Following the SiC deposition, photoresist is deposited and patterned to expose areas where isolation structures are desired, giving the structure shown in FIG. 2A. The silicon carbide, optional nitride, oxide and silicon are etched (step 130) to form trenches 90. A thin layer of oxide will typically be grown on the walls of the trench, then the trench is overfilled (step 140) with a dielectric, typically a silicon dioxide, giving the structure in FIG. 2B.

Chemical-mechanical polishing (CMP) is then performed (step 150) until all the remaining silicon carbide is exposed. Parameters in the polish step are as follows, with ranges given first and presently preferred values in parenthesis:

Polish Parameters:

| | |
|---|---|
| Downforce | 2–10 (6.5) psi |
| Back Pressure | 0.5–5 (1.5) psi |
| Table Speed | 15–100 (32) rpm |
| Carrier Speed | 15–100 (28) rpm |
| Conditioning | 1–7 (3) lbs/30 rpm/in situ/ 1.5 seconds per segment |
| Slurry Flow | 50–700 (200) ml/min |

Example of Consumables in Polish(many others can be used):

| | |
|---|---|
| Pad | ICI400, K-Groove - Vendor = Rodel |
| Slurry | SS25 diluted 3:2 with DI H2O; Vendor = Cabot |
| Backing Film | DF245, Vendor = Rodel |

Of course, the examples given above for the polish step are merely illustrative and are not limiting, as many variations are possible using the disclosed stop layer.

Following the CMP step, the silicon carbide and other dielectrics will be removed, resulting in a planar active area. In order for the CMP step to give the desired results, it is necessary to design a dummy active area pattern, i.e. area that is patterned as an active area, but is not electrically active. This dummy area serves to eliminate large trench area that would be dished during CMP planarization and could thereby cause damage to active areas at the edges of wide trenches. Instead, the dummy areas provide support for the CMP pad, allowing only minimum bending of the pad surface.

First Etch Embodiment for SiC:

In a first embodiment, the process used to etch the silicon carbide is a C12/02 etch, at about 600-900 degrees C, with a C12 flow of 1–20 liters/minute and O2 flow of 1–20 liters/minute, at atmospheric pressure. The C12/O2 will selectively etch the SiC from the SiO2 surface.

Second Etch Embodiment for SiC:

In an alternate embodiment, the process used to etch the silicon carbide is a C12 etch, at about 300 mTorr, with gas flow of 10–300 sccm, Ar flow of 0–100 sccm, O2 flow of 0–50 sccm, RF power density of about 0.5–4 W/cm2 (13.56 MHz), and magnetic field of 0–30 G. Removal rates for SiC relative to SiO2 of 10:1 have been achieved.

Third Etch Embodiment for SiC:

In an alternate embodiment, the etch uses a chemistry of CF4/O2/H2/Ar, with an O2 fraction of 0–90 percent, H2 flow of 0–20 sccm, (fluorinated-O2 gas flow of 10–50 sccm), Ar flow of 10–100 sccm, chamber pressure of about 10–50 mTorr, RF Power density of about 0.54 W/cm2 (13.56 MHz), and magnetic field of 0–30 G.

Fourth Etch Embodiment for SiC:

In a further alternate embodiment, the etch uses a SF6/O2/H2/Ar chemistry, with an O2 fraction of 0–90%, H2 flowrate of 0–20 sccm, (fluorinated-O2 gas flow 10–50 sccm), Ar flow of 10–100 sccm, a chamber pressure of about 10–50 mTorr, RF Power density of about 0.5–4 W/cm2 (13.56 MHz), and magnetic field of 0–30 G.

Fifth Etch Embodiment for SiC:

In a further alternate embodiment, the etch uses a chemistry of NF3/CHF3/CF4/Ar/O2/H2, with an O2 fraction of 0–50 percent, H2 flow of 0–100 sccm, (fluorinated-Ar gas flow of 50–200 sccm), Ar flow of 10–100, chamber pressure of about 10–50 mTorr, RF Power density of approximately 0.5–4 W/cm2 (13.56 MHz), and magnetic field of 0–30 G.

Experimental Data

The following data was taken by measurements on sheet film deposited on pilot wafers.

| Source | Deposition Temperature | CMP Selectivity to Oxide |
|---|---|---|
| TMS | 250 C. | 10.6::1 |
| TMS | 350 C. | 43::1 |
| TMS | 500 C. | 44::1 |
| Silane/Methane | 350 C. | 50::1 |

TMS = Trimethylsilane

Wafers deposited with the silane/methane chemistry appeared overall to have better CMP selectivity to SiO2 and fewer defects and film thickness uniformity. There exists some variation in CMP selectivity of SiO2::SiC dependent on the location on the wafer. The CMP removal rate selectivity near the wafer center of SiO2::SiC was actually 70::1 whereas the selectivity near the edge of the wafer was 37::1.

The high levels of CMP removal rate selectivity of oxide to silicon carbide indicate that silicon carbide is a very good stopping layer for CMP oxide planarization processes. Compared to the current state of the art using silicon nitride as a stop layer that has removal rate selectivity (oxide::nitride) of 4::1 except using advanced slurries where removal rate selectivity ranges from 12::1 to reported 20::1, silicon carbide will be much better than silicon nitride since less SiC material will be removed.

The CMP process is standard for undoped oxide removal at transistor isolation, and interlevel dielectric planarization.

Alternate Embodiments

Alloys of silicon carbide with other materials are also possible CMP stop layers. The chief difficulty in selecting these alloys is to maintain a balance between the hardness of the material, important in CMP, and the selectivity of the stop layer etch to SiO2.

SixCyNz

In one alternate embodiment, silicon carbide is alloyed with nitrogen to form a silicon carbonitride. Given the nitride bonds in this material, it may be possible to remove this layer with a wet etch, such as the hot phosphoric acid bath used to remove silicon nitride.

SixCyOz

In another alternate embodiment, silicon carbide is alloyed with oxygen to form a silicon carboxide layer. This embodiment is generally less preferred, as selectivity to oxide is not as easy to obtain with this material, due to its own oxide bonds. However, there is some evidence that the silicon carbide deposited in the primary embodiment may have more oxygen than would be expected.

SiwCxNyOz

In another alternate embodiment, silicon carbide is alloyed with both nitrogen and oxygen, forming a silicon carboxynitride.

According to a disclosed class of innovative embodiments, there is provided: A fabrication method for an integrated circuit structure, comprising the steps of: forming an oxide structure which includes, distributed there-through, a first layer comprising silicon and carbon; and polishing said oxide structure, using a slurry composition which has a selectivity to said first layer of greater than 10 to 1, so that said polishing step smoothly removes said oxide on a first side of said first layer and stops on exposed areas of said first layer; whereby said exposed areas of said first layer define a uniform surface level for said oxide structure.

According to another disclosed class of innovative embodiments, there is provided: A fabrication method for an integrated circuit structure, comprising the steps of: (a.) providing a substrate which includes a body of semiconductor material; (b.) depositing a first layer comprising silicon and carbon over said semiconductor material; (c.) forming isolation structures which extend through said first layer into said semiconductor material; (d.) filling said isolation structures with a dielectric which also extends over at least a portion of said first layer; (e.) performing polishing to planarize said integrated circuit structure; wherein said first layer acts as a polish stop for said polishing step.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. A method of fabrication for an integrated circuit, comprising:

(a) growing a silicon dioxide layer on a silicon body;

(b) forming a silicon carbide layer over said silicon dioxide layer;

(c) forming trenches in said silicon body including removing portions of said silicon carbide layer plus said silicon dioxide layer overlying locations of said trenches;

(d) depositing dielectric on said silicon carbide layer and in said trenches;

(e) chemical mechanical polishing said dielectric with polish stopping in said silicon carbide layer; and (f) removing said silicon carbide layer remaining.

2. The method of claim 1, further comprising:

(a) after said growing silicon dioxide of step (a) of claim 1, forming a silicon nitride layer on said silicon dioxide layer;

(b) wherein said forming a silicon carbide layer of step (b) of claim 1 forms said silicon carbide layer on said silicon nitride layer.

3. The method of claim 1, wherein:

(a) said removing said silicon carbide of step (f) of claim 1 includes etching with a chlorine-containing plasma.

4. A method of fabrication for an integrated circuit, comprising:

(a) forming a silicon carbide layer over a silicon body;

(b) forming trenches in said silicon body including removing portions of said silicon carbide layer overlying locations of said trenches;

(c) depositing dielectric on said silicon carbide and in said trenches;

(d) chemical mechanical polishing said dielectric with polish stopping in said silicon carbide layer; and (e) removing said silicon carbide layer remaining;

(f) wherein said forming a silicon carbide layer of step (a) includes depositing at a temperature which yields a polishing rate of said dielectric at least 43 times the polishing rate of said silicon carbide.

5. The method of claim 4, further comprising the step of:

(a) growing a silicon dioxide layer on said silicon body before forming said silicon carbide layer of step (a) of claim 4.

6. A method of fabrication for an integrated circuit, comprising:

(a) forming a $Si_wC_xX_z$ layer over a silicon body, wherein X is taken from the group consisting of N, O, and mixtures thereof;

(b) forming trenches in said silicon body including removing portions of said $Si_wC_xX_z$ layer overlying locations of said trenches;

(c) depositing dielectric on said $Si_wC_xX_z$ layer and in said trenches;

(d) chemical mechanical polishing said dielectric with polish stopping in said $Si_wC_xX_z$ layer; and (e) removing said $Si_wC_yX_z$ layer remaining.

7. The method of claim 6 wherein:

(a) X equals N.

8. The method of claim 6, wherein:

(a) X equals O.

* * * * *